United States Patent
Kang

(12) United States Patent (10) Patent No.: US 7,094,698 B2
Kang (45) Date of Patent: Aug. 22, 2006

(54) METHOD FOR DRY ETCHING A SEMICONDUCTOR WAFER

(76) Inventor: Hyo Sang Kang, Hydundai Apt. 109/1503, Eunhang1-dong, Jungwon-ku, Sungnam-city, Hyungki-do (KR)

( * ) Notice: Subject to any disclaimer, the term of this patent is extended or adjusted under 35 U.S.C. 154(b) by 181 days.

(21) Appl. No.: 10/506,478

(22) PCT Filed: Apr. 19, 2002

(86) PCT No.: PCT/KR02/00716

§ 371 (c)(1),
(2), (4) Date: Sep. 1, 2004

(87) PCT Pub. No.: WO03/075334

PCT Pub. Date: Sep. 12, 2003

(65) Prior Publication Data

US 2005/0112878 A1 May 26, 2005

(30) Foreign Application Priority Data

Mar. 4, 2002 (KR) .............................. 2002-11397

(51) Int. Cl.
*H01L 21/302* (2006.01)
(52) U.S. Cl. ................. 438/706; 438/712; 438/714
(58) Field of Classification Search ................ 438/706, 438/710, 712, 714, 719, 723; 216/58, 63, 216/67
See application file for complete search history.

(56) References Cited

U.S. PATENT DOCUMENTS

| | | |
|---|---|---|
| 5,271,798 A | 12/1993 | Sandhu et al. |
| 5,795,399 A * | 8/1998 | Hasegawa et al. ........... 134/1.3 |
| 6,261,406 B1 | 7/2001 | Jurgensen et al. |
| 6,468,889 B1 * | 10/2002 | Iacoponi et al. ............ 438/597 |
| 6,511,895 B1 * | 1/2003 | Koma et al. ................. 438/459 |
| 6,607,983 B1 * | 8/2003 | Chun et al. ................. 438/691 |
| 6,753,263 B1 * | 6/2004 | Ito et al. ..................... 438/714 |
| 6,930,047 B1 * | 8/2005 | Yamazaki et al. .......... 438/706 |
| 2005/0178505 A1* | 8/2005 | Kim ....................... 156/345.47 |

OTHER PUBLICATIONS

Cho, Byeong-Ok. et al., "Angular Dependence of the Redeposition Rates During $SiO_2$ Etching in a $CF_4$ Plasma" J. Vac. Sci. Technol. A 19(3) May/Jun. 2001, pp. 730-735.
Lee, Gyeo-Re et al. "Sidewall-angle Effect on the Bottom Etch Profile in $SiO_2$ Etching Using a $CF_4$ Plasma" J.Vac. Sci. Technol. B 19(1), Jan./Feb. 2001, pp. 172-178.
Min, Jae-Ho, et al. "Reseposition of Etch Products on Sidewalls During $SiO_2$ Etching in a Fluorocarbon Plasma. III. Effects of $O_2$ Addition to $CF_4$ Plasma" J. Vac. Sci. Technol. B21(4) Jul./Aug. 2003 American Vacuum Society, pp. 1210-1215.
Pinta, R. et al., "Reactive Etching in $SF_6Gs$ Mixtures" InP Misfet Technology Vol. 134, No. 1, Jan. 1987, pp. 165-175.
Zarowin, C.B. "Plasma Etch Anisotropy—Theory and Some Verifying Experiments Relating Ion Transport, Ion Energy, and Etch Profiles" J. Electrochem. Soc.: Solid state Science and Technology, May, 1983, pp. 1144-1152.

* cited by examiner

*Primary Examiner*—Kin-Chan Chen
(74) *Attorney, Agent, or Firm*—Squire, Sanders & Dempsey

(57) ABSTRACT

Disclosed a method for dry etching a semiconductor wafer by a plasma generated between a power-supplied first electrode and a grounded second electrode. After the bottom surface of the edge of the wafer is in contact with the first electrode, and the top surface of the edge and the side surface of the wafer are etched by ionized plasma species generated by the plasma discharge of reactive ion etching. Then, after the upper surface of the edge of the wafer is in contact with the second electrode, and the bottom surface of the edge and the side surface of the wafer are etched by radicalized plasma species generated by the plasma discharge of plasma etching.

1 Claim, 4 Drawing Sheets

METHOD FOR DRY ETCHING A SEMICONDUCTOR WAFER

TECHNICAL FIELD

The present invention relates to a method for dry etching a semiconductor wafer, and more particularly to a method for dry etching a semiconductor wafer so that materials deposited on the upper, the side, and the lower surfaces of the edge of the wafer are removed using plasma.

BACKGROUND ART

As well known to those skilled in the art, along with progressive miniaturization of semiconductor devices, fine wiring patterns of the semiconductor device are processed by various etching techniques. Generally, the etching techniques are divided two types, i.e., a wet etching and a dry etching. The wet etching has been applied to LSI (Large Scale Integration) devices, in which the widths of the lines of the devices are approximately several μms to several tens of μms. However, since there is a limit to the isotropic wet etching, VLSI (Very Large Scale Integration) devices and ULSI (Ultra Large Scale Integration) devices have been formed by the dry etching, which is capable of an anisotropic etching.

The dry etching techniques are divided into three kinds, i.e., a Chemical Reaction etching, a Physical etching, and an Ion Assisted Etching. In the chemical reaction etching, radicals in a plasma state are generated and react with an "etch object", which is an object to be etched, thereby performing an etching action. In the physical etching, ions are accelerated and the accelerated ions are physically bombarded with an etch object, thereby performing an etching action. Finally, in the ion assisted etching, an etching action generated by the radicals is assisted by the energy given by the ion bombardment.

Thin films deposited on the VLSI device are an oxide ($SiO_2$) layer, a poly-silicon (Si) layer, a tungsten silicide ($WSi_x$) layer, a nitride ($Si_3N_4$) layer, an aluminum (Al) layer, a tungsten (W) layer, etc. For the purpose of satisfying both an anisotropic characteristic other than an isotropic characteristic of the etching, and etching selectivity according to the miniaturization and the high integration of the device, these thin films are etching by using plasma, thereby forming wirings and holes on the device.

FIG. 1 shows a conventional dry etching method using plasma. An electric field or an electromagnetic field is induced between two electrodes such as an anode 100 and a cathode 200. Thereby, plasma P is generated above the upper surface of a wafer 300. Then, materials deposited on the upper surface of the wafer 300 are etched using a photoresist pattern as an etching mask. Herein, in order to optimize the etching condition such as etching rate, etching uniformity, and etching selectivity, the distance between two electrodes 100, 200 is regulated by vertically moving one of two electrodes 100, 200.

However, only the materials deposited only on the upper surface 300a of the edge of the wafer is removed by this conventional dry etching method. Therefore, the problem is that the materials deposited on the side surface 300b and the lower surface 300c of the edge of the wafer 300 are not removed.

DISCLOSURE OF THE INVENTION

Therefore, the present invention has been made in view of the above problems, and it is an object of the present invention to provide a method for dry etching a semiconductor wafer so that materials deposited on the side and the lower surfaces as well as the upper surface of the edge of the wafer are removed using plasma.

In accordance with the present invention, the above and other objects can be accomplished by the provision of a method for dry etching a semiconductor wafer by generating plasma between a power-supplied first electrode and a grounded second electrode. The method for dry etching a semiconductor wafer comprises the steps of generating plasma after bring the lower surface of the edge of the wafer in contact with the first electrode, and etching the upper surface and the side surface of the edge of the semiconductor wafer by reactive ion etching (RIE) using ionized species, and generating plasma after bring the upper surface of the edge of the wafer in contact with the second electrode, and etching the lower surface and the side surface of the edge of the semiconductor wafer by plasma etching using radicals.

BRIEF DESCRIPTION OF THE DRAWINGS

The above and other objects, features and other advantages of the present invention will be more clearly understood from the following detailed description taken in conjunction with the accompanying drawings, in which.

BEST MODE FOR CARRYING OUT THE INVENTION

Hereinafter, two types of the dry etching method, which are a theoretical base of the present invention, are described in detail.

Figure 1:
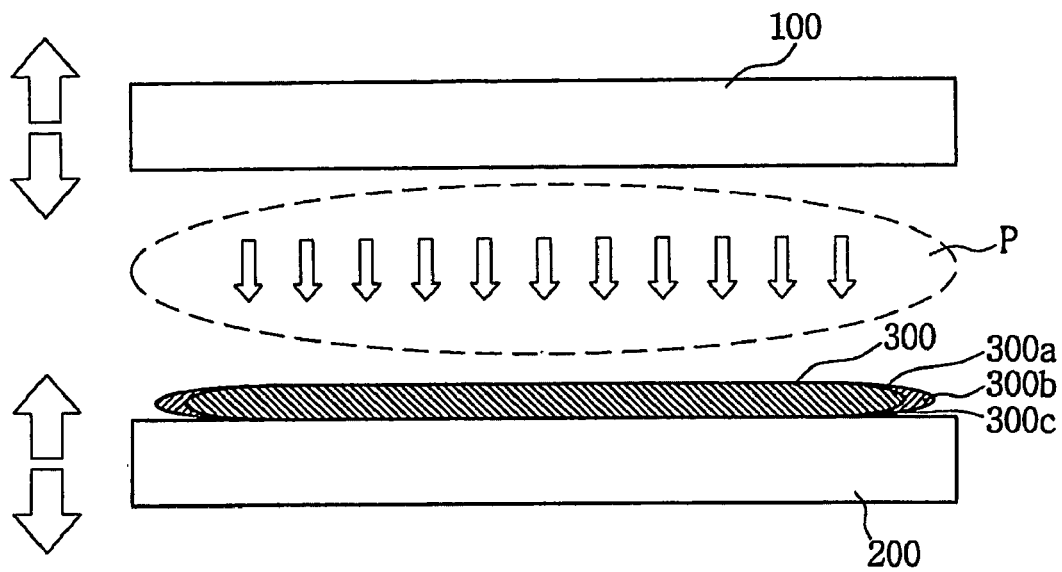
FIG. 1 is a schematic view illustrating a conventional dry etching using plasma.
Figure 2:
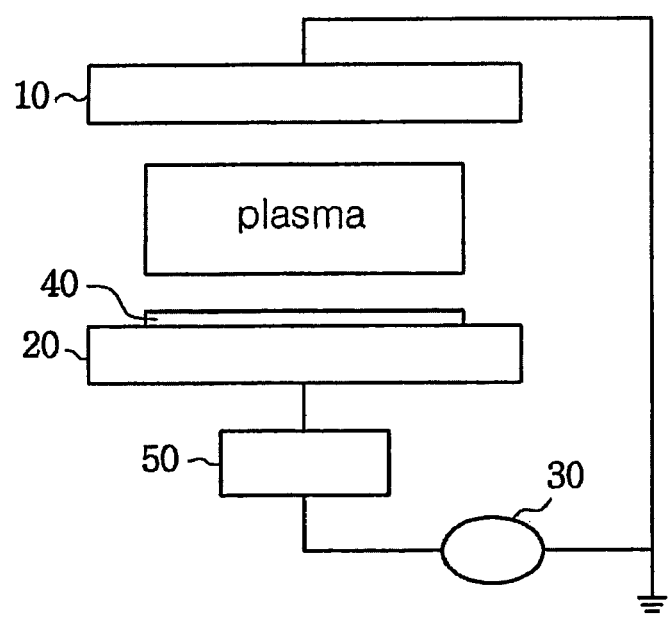
FIG. 2 is a schematic view illustrating a reactive ion etching (RIE)
Figure 3:
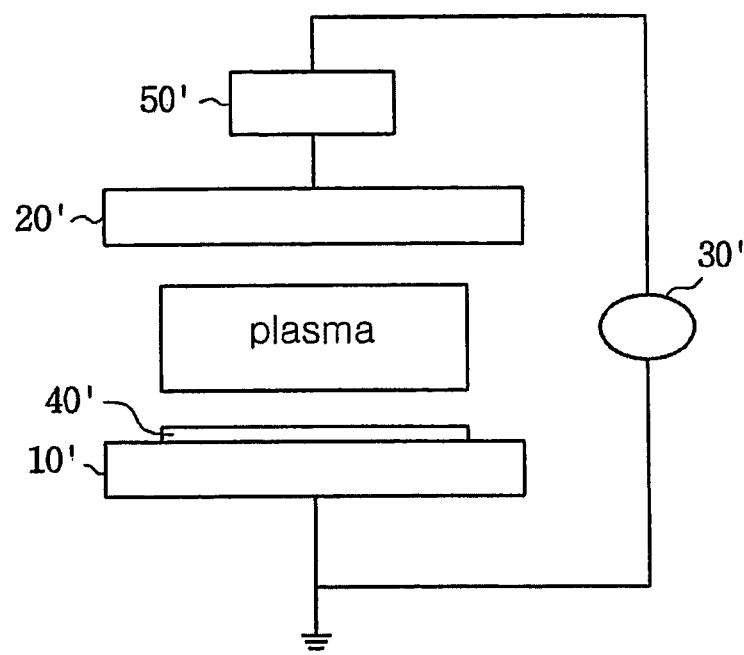
FIG. 3 is a schematic view illustrating a plasma etching.

FIGS. 2 and 3 illustrate a reactive ion etching (RIE) and a plasma etching, respectively. As shown in FIGS. 2 and 3, an anode 10 or 10' and a cathode 20 or 20' are installed within a vacuum chamber (not shown). A reactive gas is introduced into the vacuum chamber. Power is supplied from a RF (Radio Frequency) generator to the cathode 20 or 20'. Then, an electric field is formed between the anode 10 or 10' and the cathode 20 or 20'. The introduced reactive gas repeatedly passes through dissociation, ionization, dissociation and ionization, excitation, and recombination by inelastic collision with accelerated electrons within this electric field, thereby generating plasma.

For example, if $CF_4$ gas is used as the reactive gas, $CF_4$ gas is dissociated into $CF_3$, $CF_2$, $CF$, $C$, and $F$, then ionized into $CF^{3+}$, $CF^{2+}$, $CF^+$, $C^+$, and $F^+$, and excited to $CF^{3*}$, $CF^{2*}$, $CF^*$, $C^*$, and $F^*$ radicals. Then, it is recombined into $C_2F_4$ and $C_2F_6$.

Herein, the generated plasma typically contains active species such as neutral radicals and positively charged ions.

Among the plasma species, $CF^{3+}$, $CF^{2+}$, $CF^+$, $C^+$, and $F^+$ ions are accelerated and arrived on the edge of a wafer 40 mounted on the cathode 20, to which RF power is supplied, thereby performing a physical etching of the edge of the wafer 40. That is, in case that the wafer 40 is mounted on the RF power-supplied cathode 20, the RIE etching is performed, with reference to FIG. 2.

On the other hand, as shown in FIG. 3, in case that the wafer 40' is mounted on the anode 10', which is grounded, excited species such as $CF^{3*}$, $CF^{2*}$, $CF^*$, $C^*$, and $F^*$ radicals other than ionized species perform a chemical etching of the edge of the wafer 40'. Hereinafter, this is referred to as plasma etching.

Reference number 50 and 50' are matching units.

Herein, $CF_4$ gas, which is used as the reactive gas, serves to form plasma to etch the oxide layer. However, many other gas may be used to etch different material, e.g., $O_2$ gas for etching a photoresist layer, $Cl_2$ gas for etching a poly-silicon layer, an aluminum layer, or a tungsten layer, and $SF_6$ gas for etching the nitride layer. With these various gas, the above-described two types of the dry etching method are carried out.

Based on the above-described two types of the dry etching, a method for dry etching a semiconductor wafer in accordance with the present invention is described hereinafter.

Figure 4:
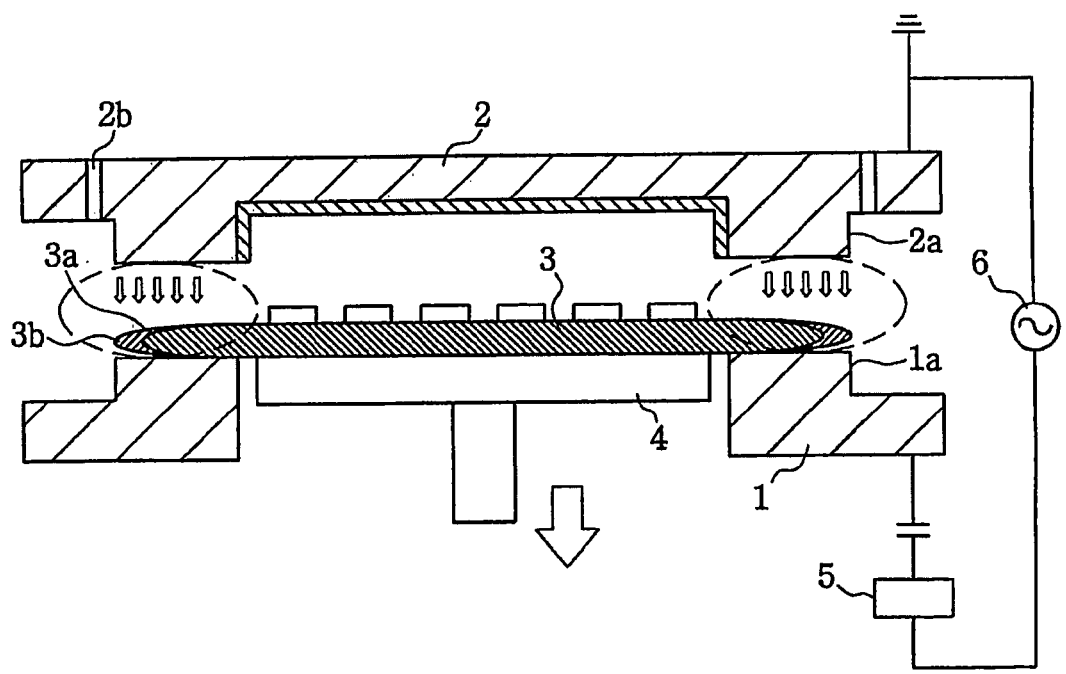
FIG. 4 is a schematic view illustrating a reactive ion etching (RIE) of a dry etching method of the present invention.
Figure 5:
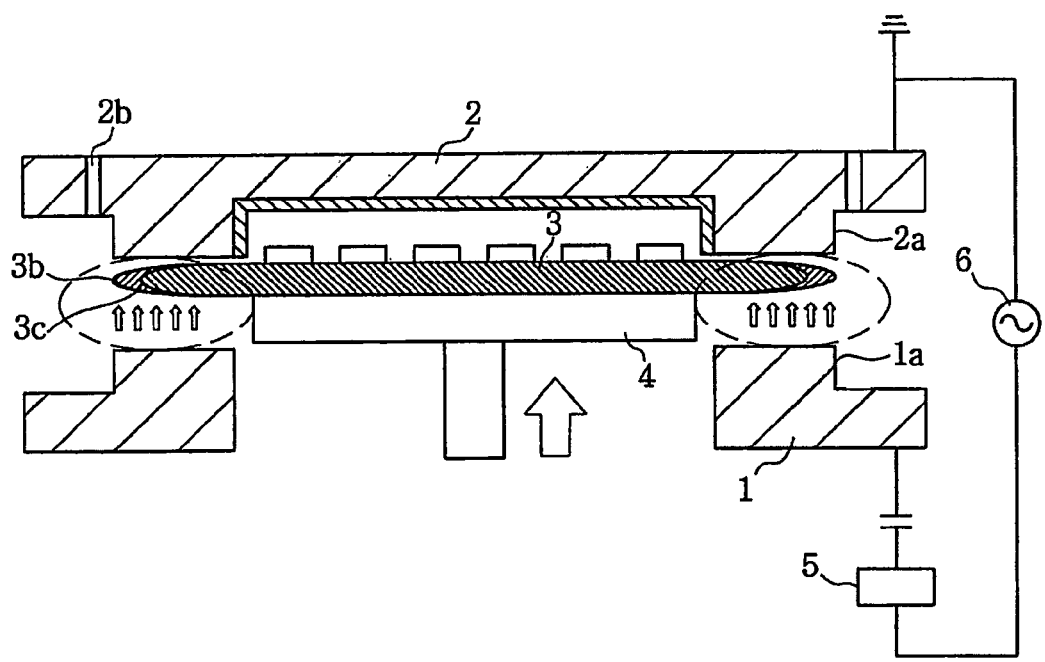
FIG. 5 is a schematic view illustrating a plasma etching of the dry etching method of the present invention.
Figure 6:
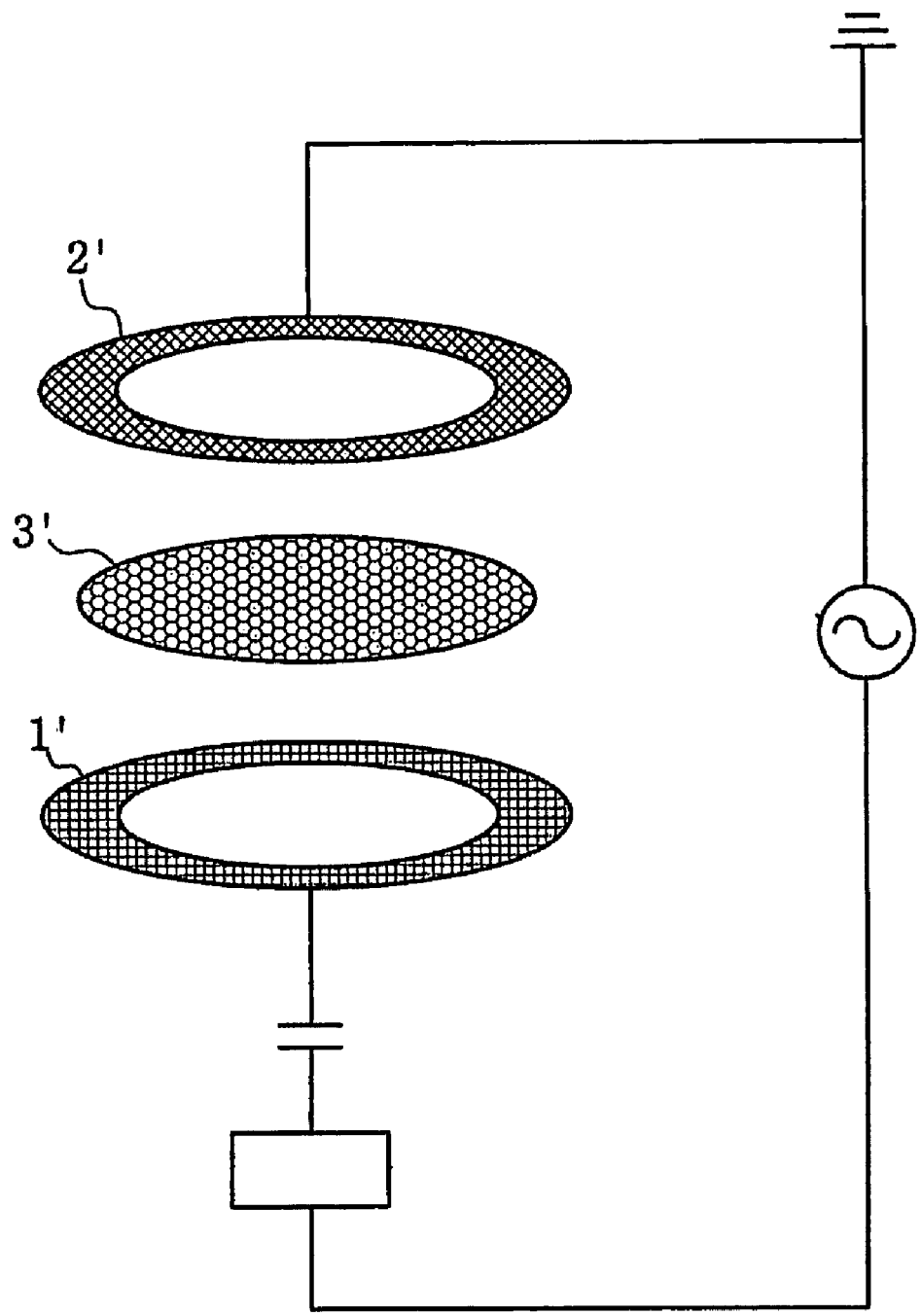
FIG. 6 is a schematic view of a ring-shaped electrode using the dry etching method of the present invention.

FIGS. 4 and 5 illustrate a reactive ion etching (RIE) and a plasma etching of the dry etching method of the present invention. FIG. 6 shows a ring-shaped electrode using the dry etching method of the present invention. In order to apply the dry etching method of the present invention, it is preferable to use a pair of electrodes, i.e., a first electrode 1 and a second electrode 2, each electrode having a protrusion, i.e., a first protrusion 1a and a second protrusion 2a, corresponding to the edge of a wafer 3 to be etched, as shown in FIGS. 4 and 5, or to use a pair of ring=shaped electrodes 1', 2' as shown in FIG. 6.

As shown in FIGS. 4 and 5, the first electrode 1 and the second electrode 2 are installed within a vacuum chamber (not shown). An electrostatic chuck 4 for mounting the wafer 3 is positioned between the first electrode 1 and the second electrode 2 through an opening of the first electrode 1. A gas inlet hole 2b is formed on the second electrode 2. The gas inlet hole 2b serves to introduce a reactive gas for generating plasma into the vacuum chamber. The first electrode 1 is connected to a RF generator 6 via a matching unit 5, and the second electrode 2 is grounded.

In this structure of the vacuum chamber, as shown in FIG. 4, the wafer 3 is mounted on the electrostatic chuck 4 and the electrostatic chuck 4 is positioned at a lowering position, thereby bringing lower surface 3c of the edge of the wafer 3 to be etched into contact with the upper surface of the first protrusion 1a of the first electrode 1. The reactive gas is introduced into the vacuum chamber via the gas inlet hole 2b of the second electrode 2 and power is supplied from the RF generator 6, thereby forming an electric field between the first electrode 1 and the second electrode 2. Then, the introduced reactive gas repeatedly passes through dissociation, ionization, dissociation and ionization, excitation, and recombination by inelastic collision with accelerated electrons within this electric field, thereby generating plasma.

Among the generated plasma species, the aforementioned ionized species such as $CF^{3+}$, $CF^{2+}$, $CF^+$, $C^+$, and $F^+$ ions, are accelerated and arrived on the surface of the wafer 4, thereby performing the RIE etching. Herein, the etching action is not performed on the central area of the wafer containing fine circuit patterns but is finely performed on the upper surface 3a and the side surface 3b of the edge of the wafer 3.

The RIE is performed by the plasma species. That is, materials deposited on the upper and the side surfaces of the edge of the wafer, such as a nitride layer, a oxide layer, a poly-silicon layer, an aluminum layer, a tungsten layer, etc., are finely etched by the straight motion of the ionized species more then the radicals of the plasma species.

For reference, Table 1 illustrates the etching process by the ion reaction using Fluorine gas or Chlorine gas.

TABLE 1

| Etching using Fluorine gas | |
|---|---|
| Nitride layer | $Si_3N_4 + 12CF^{3+}$ $3SiF_4 + 2N_2 + 12C$ |
| Poly-silicon | $3Si + 4CF^{3+}$ $3SiF_4 + 4C$ |
| Oxide layer | $3SiO_2 + 4CF^{3+}$ $3SiF_4 + 3CO_2 + C$ |
| Tungsten | $W + 2CF^{3+}$ $WF_6 + 2C$ |
| Etching using Chlorine gas | |
| Silicon | $3Si + 4CCl^{3+}$ $3SiCl_4 + 4C$ |
| Tungsten | $W + 2CCl^{3+}$ $WCl_6 + 2C$ |
| Aluminum | $Al + CCl^{3+}$ $AlCl_3 + C$ |

As shown in FIG. 5, the wafer 3 is elevated and positioned at an elevating position, thereby bringing the upper surface 3a of the edge of the wafer 3 to be etched into contact with the second protrusion 2a of the second electrode 2. The reactive gas is introduced into the vacuum chamber via the gas inlet hole 2b of the second electrode 2 and power is supplied from the RF generator 6, thereby also forming an electric field between the first electrode 1 and the second electrode 2. The introduced reactive gas repeatedly passes through dissociation, ionization, dissociation and ionization, excitation, and recombination by inelastic collision with accelerated electrons within this electric field, thereby generating plasma.

Among the generated plasma species, the radicals such as $CF^{3*}$, $CF^{2*}$, $CF^*$, $C^*$, and $F^*$ ions chemically react with the lower surface 3c and the side surface 3b of the edge of the wafer 3, thereby performing the aforementioned plasma etching. Therefore, materials deposited on the lower surface 3c and the side surface 3b of the edge of the wafer 3 are effectively removed with minimizing plasma damage.

That is, when the upper surface 3a of the edge of the wafer 3 is in contact with the grounded second electrode 2, materials deposited on the edge of the wafer such as the nitride layer, the oxide layer, the poly-silicon layer, the aluminum layer, the tungsten layer, etc, are etched by the radicals other than the ionized reactive gas of the plasma species.

Table 2 illustrates the etching process by the chemical reaction using Fluorine gas or Chlorine gas.

TABLE 2

| Etching using Fluorine gas | |
|---|---|
| Nitride layer | $Si_3N_4 + 12F^*$ $3SiF_4 + 2N_2$ |
| Poly-silicon | $Si + 4F^*$ $SiF_4$ |
| Oxide layer | $SiO_2 + 4F^*$ $SiF_4 + O_2$ |
| Tungsten | $W + 6F^*$ $WF_6$ |
| Etching using Chlorine gas | |
| Silicon | $Si + 4Cl^*$ $SiCl_4$ |
| Tungsten | $W + 6Cl^*$ $WCl_6$ |
| Aluminum | $Al + 3Cl^*$ $AlCl_3$ |

As above-described, each of the first electrode 1 and the second electrode 2 has the corresponding one of the first protrusion 1a and the second protrusion 2a on its opposite surface, respectively. However, in case using a pair of ring-shaped electrodes 1', 2' as shown in FIG. 6, a wafer 3' is lowered or elevated between the first electrode 1' and the second electrode 2', thereby brining the lower surface of the edge of the wafer 3' into contact with the first electrode 1' or bringing the upper surface of the edge of the wafer 3' into contact with the second electrode 2'. Thus, the upper surface and the side surface of the edge of the wafer 3' are etched by reactive ion etching, and the side surface and the lower surface of the wafer 3' are etched by plasma etching.

Although the preferred embodiments of the present invention have been disclosed for illustrative purposes, those skilled in the art will appreciate that various modifications, additions and substitutions are possible, without departing from the scope and spirit of the invention as disclosed in the accompanying claims

INDUSTRIAL APPLICABILITY

As apparent from the above description, the present invention provides a method for dry etching a semiconductor wafer, which removes foreign materials deposited on the upper, the side and the lower surfaces of the edge of the semiconductor wafer, without additional equipment or step, thereby simplifying the whole process, reducing the process cost, and improving the yield, the quality of the semiconductor wafer, and its productivity.

The invention claimed is:

1. A method for dry etching a semiconductor wafer by generating plasma between a power-supplied first electrode and a grounded second electrode, said method comprising the steps of:

generating plasma after bring the lower surface of the edge of the wafer in contact with said first electrode, and etching the upper surface and the side surface of the edge of the semiconductor wafer by reactive ion etching (RIE) using ionized species; and generating plasma after bring the upper surface of the edge of the wafer in contact with said second electrode, and etching the lower surface and the side surface of the edge of the semiconductor wafer by plasma etching using radicals.

* * * * *